United States Patent
Kunkee et al.

[11] Patent Number: 6,167,172
[45] Date of Patent: Dec. 26, 2000

[54] TAPERED AMPLITUDE OPTICAL ABSORBER FOR WAVEGUIDE PHOTODETECTORS AND ELECTRO-ABSORPTION MODULATORS

[75] Inventors: Elizabeth T. Kunkee, Manhattan Beach; Timothy A. Vang, San Dimas, both of Calif.

[73] Assignee: TRW Inc., Redondo Beach, Calif.

[21] Appl. No.: 09/264,374

[22] Filed: Mar. 5, 1999

[51] Int. Cl.[7] .................................................. G02B 6/26
[52] U.S. Cl. ............................. 385/28; 385/14; 385/31; 385/50; 385/43
[58] Field of Search ................................ 385/28, 37, 27, 385/24, 31, 16, 39, 43, 50, 47, 3, 8, 11, 14

[56] References Cited

U.S. PATENT DOCUMENTS

| | | |
|---|---|---|
| 3,832,029 | 8/1974 | Bryngdahl . |
| 4,950,045 | 8/1990 | Bricheno et al. . |
| 5,689,597 | 11/1997 | Besse ........................................ 385/39 |
| 5,949,931 | 9/1999 | Kitamura ................................. 385/28 |

*Primary Examiner*—Phan T. H. Palmer
*Attorney, Agent, or Firm*—Michael S. Yatsko

[57] ABSTRACT

An optical waveguide device (30) that limits the peak optical intensity applied to an optical absorbing device (36), such as a photodetector or electro-absorption modulator. The optical waveguide device (30) includes a single mode input waveguide (34) coupled to a multi-mode, waveguide interference coupler (32). A single mode output waveguide (38) collects the light from the interference coupler (32). The absorbing device (36) is defined in the waveguide coupler (32) by a reverse-biased p-i-n diode structure. A voltage potential applied to the diode structure creates an electric field across the waveguide coupler (32) that causes the waveguide coupler (32) to absorb. Light entering the interference coupler (32) from the single mode waveguide (34) expands into other propagation modes that interact to constructively and destructively interfere. Because the light expands in the coupler (32), the amplitude of the light decreases even though the overall power remains substantially the same. When the light recombines as it approaches the output waveguide (38), the amplitude of the light returns to the input amplitude. The absorbing device (36) is defined in the waveguide coupler (32) between the area of interference (24) and the output waveguide (38). The absorption in the absorbing device (36) is exponential; the most light is absorbed at first and then progressively less light along the device.

21 Claims, 2 Drawing Sheets

TAPERED AMPLITUDE OPTICAL ABSORBER FOR WAVEGUIDE PHOTODETECTORS AND ELECTRO-ABSORPTION MODULATORS

This invention was made with Government support under a restricted contract awarded by a Government Agency. The Government has certain rights in this invention.

BACKGROUND OF THE INVENTION

1. Field of the Invention

This invention relates generally to an optical absorbing device and, more particularly, to a tapered amplitude, optical absorbing device, such as waveguide photodetector or electro-absorption modulator, in combination with a multi-mode interference coupler.

2. Discussion of the Related Art

Optical absorbing devices, such as photodetectors and electro-absorption modulators, are devices that operate by absorbing light. Photodetectors operate as optical to electrical converters. As a photodetector absorbs light, electron-hole pairs are generated which create an electrical photocurrent. A constant electric field is applied to the photodetector, and the photocurrent is a measure of the absorbed light intensity. Electro-absorption modulators operate as electrical to optical converters. A constant light intensity and a varying electric field are applied to the electro-absorption modulator. As the modulator absorbs the light, the electric field modulates the optical intensity of the light to convert the light intensity to a modulated intensity.

There are generally two device configurations for photodetectors and electro-absorption modulators. These configurations include a surface normal configuration and a waveguide configuration. When a waveguide configuration is employed, the light is typically input into a single mode waveguide having a dimension of approximately 2 $\mu$m×2 $\mu$m in cross-section. Light is absorbed by the device as the optical mode propagates along the waveguide. The absorption length typically varies between 25 $\mu$m and 500 $\mu$m.

The operation of photodetectors and electro-absorption modulators is limited by optical power saturation that may generate an excessively high electrical current density. The excessively high electrical current density can cause device failure. Because photodetectors are designed to absorb all of the light which falls on them, device failure caused by excessively high electrical current density is a significant problem. Also, saturation in a photodetector results in reduced responsivity that affects the optical to electrical conversion efficiency. For electro-absorption modulators, saturation causes a reduced modulation efficiency and can in some cases result in reduced bandwidth and RF linearity. Although still a concern, device failure for electro-absorption modulators is less of a problem than saturation because they are designed to intensity modulate the light and only absorb a portion of the incident light. Therefore, optical saturation poses serious limitations for the usefulness of photodetectors and electro-absorption modulators.

Optical absorption is exponential for an absorbing device that incorporates a uniform waveguide. This exponential absorption is defined as $A=Ke^{-\alpha x}$, where $\alpha$ is the absorption constant and x is the distance along the device. The fundamental problem with existing waveguide photodetectors and electroabsorption modulators, as discussed above, is in this exponential absorption characteristic. The bulk of the light is absorbed at the beginning of the waveguide, with less and less absorption per unit length as the light propagates To overcome this problem, it is possible to design the device to have a very low absorption per unit length. The drawback to this approach, however, is that the device becomes very long, which limits bandwidth because of the RC limit.

What is needed is an optical absorption device, such as a photodetector or electro-absorption modulator, that does not suffer from the optical saturation problems discussed above. It is therefore an object of the present invention to provide an improved photodetector and electro-absorption modulator.

SUMMARY OF THE INVENTION

In accordance with the teachings of the present invention, an optical waveguide device is disclosed that limits the peak optical intensity applied to an optical absorbing device, such as a photodetector or electro-absorption modulator. The optical waveguide device includes a single mode input waveguide coupled to a multi-mode, waveguide interference coupler. A single mode output waveguide collects the light from the interference coupler. Light entering the interference coupler from the single mode waveguide expands into other propagation modes that interact to constructively and destructively interfere. Because the light expands in the coupler, the amplitude of the light decreases even though the overall power remains substantially the same. When the light recombines as it approaches the output waveguide, the amplitude of the light returns to the input amplitude.

The absorbing device is defined in the waveguide coupler between the area of interference and the output waveguide. The absorbing device absorbs less light at first due to the expansion of the power in the coupler and then progressively absorbs more light as the light amplitude increases toward the output waveguide. Therefore, the exponential nature of the absorption is countered by the tapering of the intensity such that the overall per unit volume absorption of the absorbing device remains substantially constant, even though the amplitude of the light is increasing.

In one embodiment, the absorbing device is defined in part of the waveguide coupler by a reverse-biased p-i-n diode structure. A voltage potential applied to the diode structure locally creates an electric field in the waveguide coupler that causes only the biased region to absorb.

Additional objects, advantages, and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to a tapered amplitude optical absorber for waveguide photodetectors and electro-absorption modulators is merely exemplary in nature and is in no way intended to limit the invention or its applications or uses.

The invention, described in detail below, is a simple and practical way of easing the optical power handling limitations of photodetectors and electro-absorption modulators, referred to collectively below as optical absorbing devices. In general, the invention tapers the optical amplitude that is incident on the absorbing device, so that the amplitude is small at first, and then becomes larger as the light propagates further into the device. The amplitude tapering is designed to achieve a nearly constant optical absorption (per unit volume) in the device, while not incurring excess loss.

Figure 1:
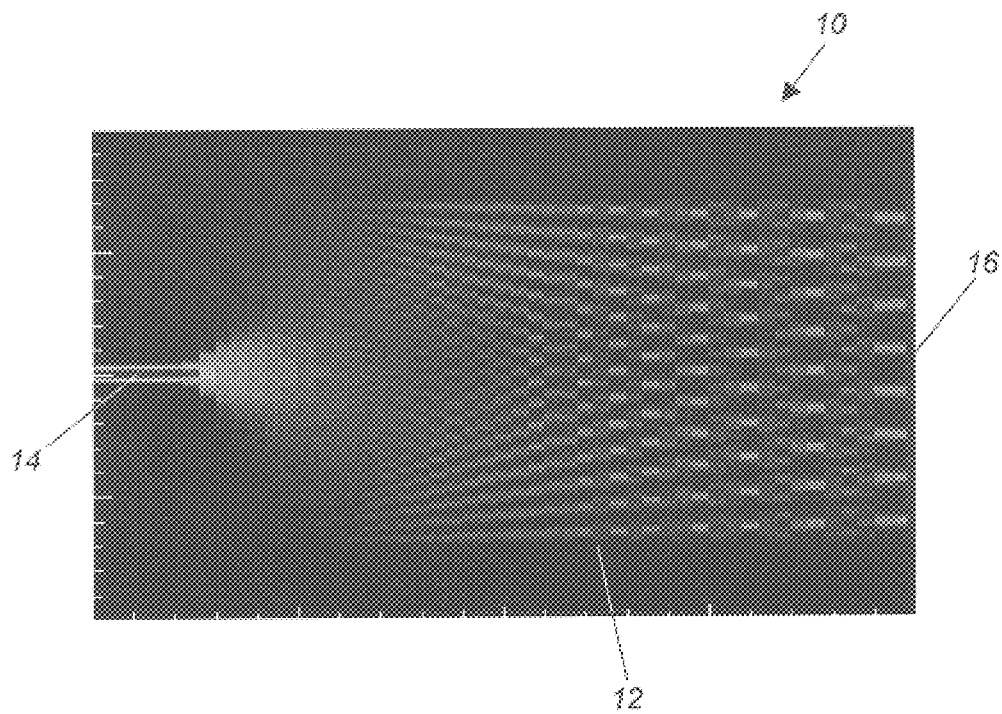
FIG. 1 shows light propagating through a multi-mode interference coupler.

According to the invention, the absorbing waveguide structure is positioned within a self-imaging multi-mode interference coupler (MIC) that provides the optical amplitude tapering. FIG. 1 is a diagrammatic view of an MIC 10 including an optical waveguide cavity 12 that can be used for this purpose. A single mode input waveguide 14 is light coupled to the cavity 12. Light propagating from the waveguide 14 into the cavity 12 expands into other propagation modes. The relative phase relationship between the various modes causes them to constructively and destructively interfere with each other. This interference creates an area 16 of alternating bright and dark regions across the cavity 12, where the bright regions are formed by constructively interfering light and the dark regions are formed by destructively interfering light. The location of the area 16 within the cavity 12 is determined by the size (length and width) of the cavity 12, the effective refractive index within the cavity 12 and the wavelength of the light propagating therethrough. By coupling a single mode waveguide (not shown) to an output end of the MIC 12, the light is coupled or refocused back into a single mode. An MIC of this type is discussed in U.S. Pat. No. 4,950,045.

Figure 2:
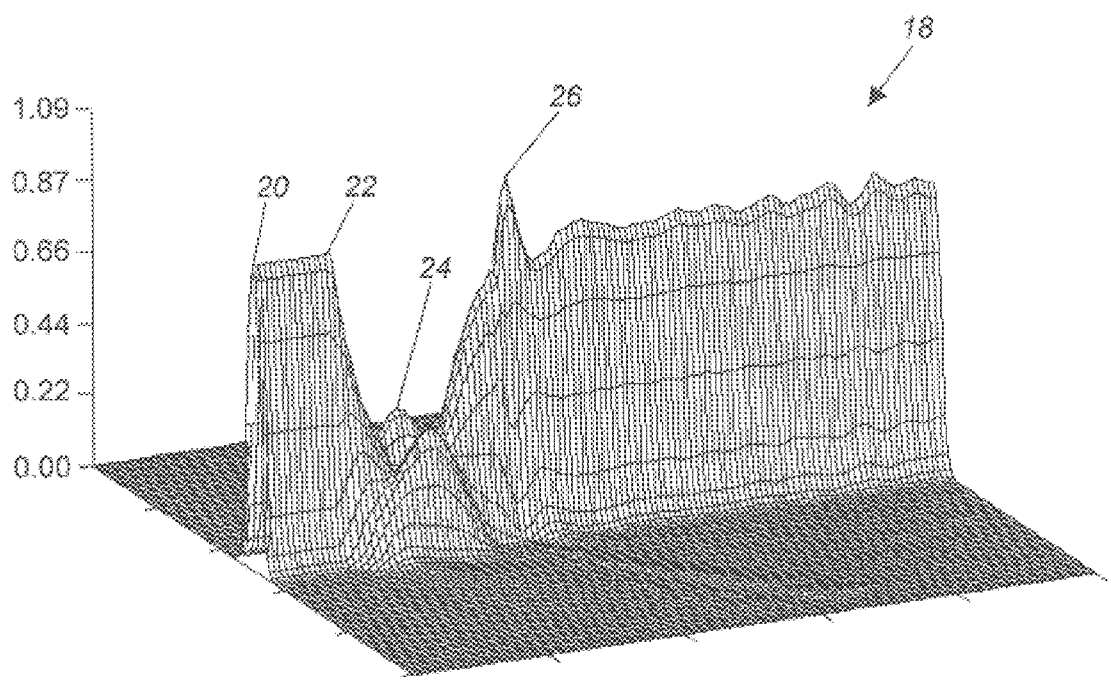
FIG. 2 is a graph also showing light propagating through a multi-mode interference coupler.

In the region where the light is refocused back into a single optical mode after the area 16, the optical intensity per unit volume increases with distance for an MIC having no absorption. This concept can be shown by a three-dimensional graph 18 in FIG. 2. The area 20 of the graph 18 shows the single mode input waveguide 14 where the optical intensity is at its greatest amplitude. The light enters the MIC cavity at area 22. The peaks at area 24 represent the location in the MIC cavity where the higher order optical modes constructively interfere, and the peak light amplitude is lowered. In this example, the MIC is only wide enough to support enough modes to create two constructively interfering locations, as opposed to the eight locations in the cavity 12 of FIG. 1. The peak amplitude of the optical signal is reduced by the additional propagation modes in the MIC 10, but the overall power of the light is the same. In the area 26, the light is coupled back into a single mode output waveguide of the MIC. The amplitude of the light has increased back to the original amplitude. The turbulence at 26 is a remnant of the modeling software.

According to the invention, the absorbing device is positioned in the region of the MIC where the amplitude of the light is increasing or being refocused towards the single mode output waveguide. Particularly, the absorbing device will be positioned between the areas 24 and 26. The specific location of the absorbing device in the MIC would depend on many factors and criteria for a particular application, such as the length of the absorbing device, the width of the MIC cavity, the intensity of the light, etc. When the absorbing device is in this position, the absorption of light per unit volume remains substantially constant, and therefore the photocurrent per unit area remains substantially constant. In other words, the absorbing device is positioned in the MIC between the area 24 and the area 26, so that as the optical amplitude of the light increases towards the single mode output waveguide, the absorbing device absorbs the optical power, reducing the light intensity at the front of the device. The amount of light absorbed along the entire length of the absorber remains substantially constant because the exponential absorption of the device ($A=Ke^{-\alpha x}$) is balanced by the focusing of the light in the MIC waveguide structure.

In one embodiment, a reverse-biased p-i-n semiconductor structure is used for both the photodetector and electro-absorption modulator. For the electro-absorption modulator, a top p+ contact layer would be etched away in the expanding region of the MIC. This region would remain unbiased, and thus transparent. A reverse bias is applied to the absorbing region to make the region absorbing. Alternately, for either the photodetector or modulator, regrowth can be used to fabricate two separate epitaxial layer structures, one for the absorbing region and one for the transparent region. This embodiment is discussed below.

Figure 3:
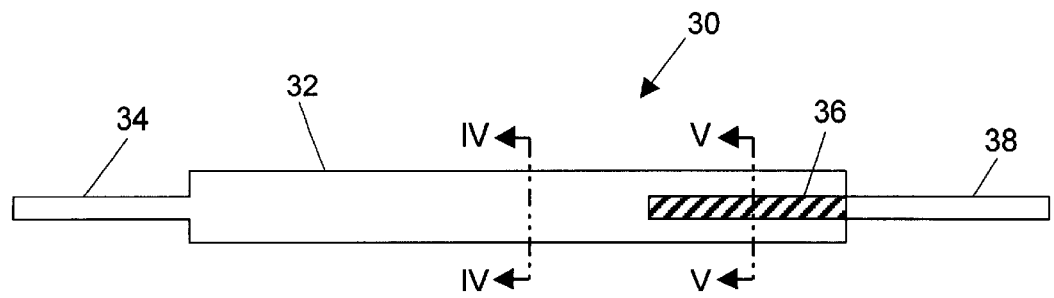
FIG. 3 is a top view of a waveguide multi-mode interference coupler in combination with a optical or electrical conversion structure, according to an embodiment of the present invention.

FIG. 3 shows a top view of an MIC device 30 including an MIC cavity 32. A single mode input waveguide 34 is coupled to an input end of the cavity 32. An optical absorbing device 36 is defined within the cavity 32 at a location consistent with the discussion above where the light is being refocused and channeled back into a single mode output waveguide 38. In one embodiment, the waveguides 34 and 38, the cavity 32 and the absorbing device 36 are formed by semiconductor epitaxial fabrication techniques. The cavity 32 can be, for example, about 334 $\mu$m in length, 3 $\mu$m thick, and about 12 $\mu$m wide. Also, the device 30 is made of InP and InGaAsP semiconductor layers, although other semiconductor materials may also be applicable.

Figure 4:
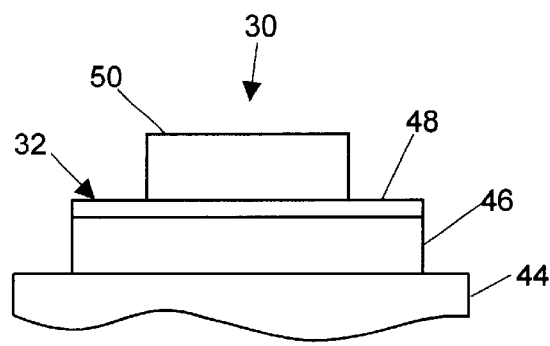
FIG. 4 is a cross-sectional view through line 4—4 of the coupler shown in FIG. 3.

FIG. 4 is a cross-sectional view of the device 30 through line IV that depicts some of the semiconductor layers. In one embodiment, the semiconductor substrate (not shown) on which the layers are fabricated is an InP substrate. The various semiconductor layers deposited on the substrate include an n+ doped InP layer 44, an n doped InP layer 46, an intrinsic InGaAsP waveguide layer 48 and a p doped InP layer 50. The layer 48 is made up of InGaAsP multiple-quantum-wells (MQWs). The light propagates in the waveguide centered on layer 48. The layers 46 and 50 are cladding layers that confine the light within the waveguide layer 48. The layers 46, 48 and 50 also provide a diode structure for applying an electric field across the MQW layer 48. The step configuration of the layer 50 limits the usable width of the waveguide layer 48. In one embodiment, this usable width is about 12 $\mu$m. This width controls the number of optical modes allowed in the MIC.

Figure 5:
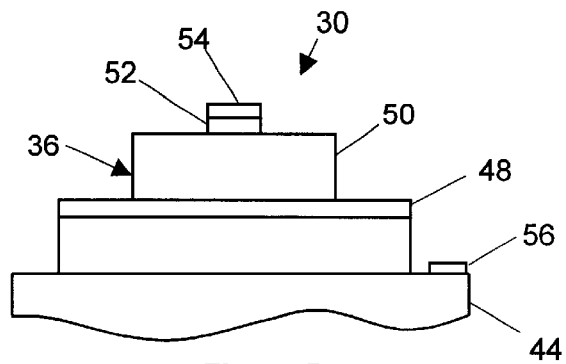
FIG. 5 is a cross-sectional view through line 5—5 of the coupler shown in FIG. 3.
Figure 6:
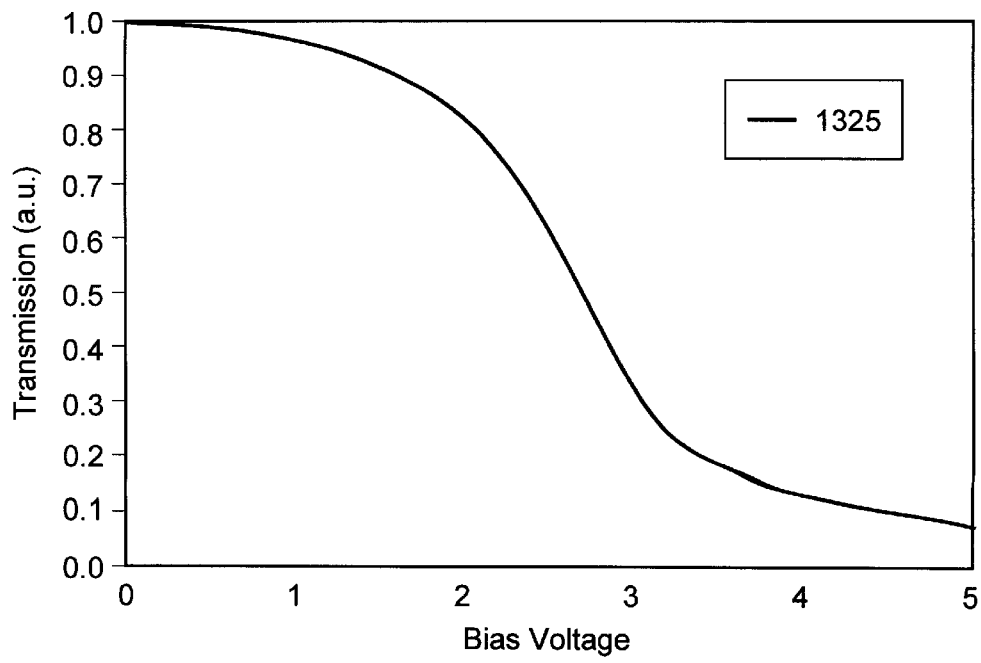
FIG. 6 is a graph showing a transmission versus voltage curve for an electro-absorption device of the invention.

FIG. 5 is a cross-sectional view of the device 30 through line V. In this region of the cavity 32, the absorbing device 36 is defined by the electric field across the waveguide layer 48. To provide this electric field, a p+ InGaAs layer 52 is deposited on the layer 50 and a p-ohmic metal contact 54 is deposited on the layer 52. An n-ohmic metal contact 56 is deposited on the layer 44. When a potential voltage difference is applied to the contacts 54 and 56, an electric field is created across the waveguide layer 48 making it an optical absorbing waveguide layer. The p-i-n diode structure created by the layers 46, 48 and 50 is reverse biased.

By the design discussed above, a short active or absorbing region can be employed because the absorbing region is not subjected to the full light amplitude. For the photodetector absorber, the electric field remains substantially constant, and the measure of the photocurrent gives the optical intensity. For the electro-absorption device, the input light intensity remains constant, and the electric field is varied to modulate the light. The contacts 54 and 56 are formed on the device 30 at a location where the light amplitude is increasing so that as the light is absorbed, the photocurrent density remains substantially constant. This prevents the device from being saturated and thus decreases device failure.

FIG. 5 shows a representative transmission versus voltage curve for the electro-absorption modulator embodiment. When the p-i-n region of the device 30 is unbiased (0V), the device does not absorb and all of the light is transmitted through. When the p-i-n region is biased (4V), the device 30 absorbs light. The actual operating point for the absorbing portion of the device 30 would be at the 50% transmission point.

In an alternate embodiment, the device structure consists of waveguide layers, where the top layer is an absorber and all layers are nominally undoped. Electrical contact is made to the absorber through a metal-semiconductor-metal structure. There would be no absorption in the input waveguide region and the expanding region of the MIC (the first half of the MIC) because the top absorbing layer would be etched off in this region.

The foregoing discussion discloses and describes merely exemplary embodiments of the present invention. One skilled in the art will readily recognize from the discussion above, and from the accompanying drawings, that various changes, modifications and variations can be made therein without departing from the spirit and scope of the invention as defined in the following claims.

What is claimed is:

1. An optical system comprising:
   an optical input waveguide responsive to an optical signal, said input waveguide allowing propagation of only a limited number of optical modes of the optical signal;
   a multi-mode interference coupler coupled to the input waveguide and receiving the optical signal, said coupler causing the optical signal to expand into more optical propagation modes of the optical signal and creating an area of constructive and destructive interference from the interaction of the optical modes; and
   an optical absorbing device defined within the coupler at a location relative to the area of constructive and destructive interference.

2. The system according to claim 1 wherein the optical absorbing device is selected from the group consisting of photodetectors and electro-absorption modulators.

3. The system according to claim 1 further comprising an output waveguide coupled to the coupler opposite to the input waveguide, wherein the optical modes in the coupler recombine into the limited number of optical modes in the output waveguide.

4. The system according to claim 3 wherein the optical absorbing device is defined within the coupler between the area of interference and the output waveguide.

5. The system according to claim 1 wherein the optical absorbing device is defined within the coupler at a location where the amplitude of the optical signal is increasing within the optical absorbing device.

6. The system according to claim 1 wherein the coupler includes a plurality of semiconductor layers, said semiconductor layers including a p-type layer, an intrinsic layer and an n-type layer forming a p-i-n diode structure, said absorbing device being defined by the p-i-n diode structure.

7. The system according to claim 6 wherein the intrinsic layer is a multiple quantum well layer that is an optical waveguide within the coupler and the p-type layer and the n-type layer are cladding layers.

8. The system according to claim 6 further comprising a p-ohmic metal in contact with the p-type layer and an n-ohmic metal in contact with the n-type layer, said metals providing an electric potential to the diode structure to generate an electric field across the diode structure to make the coupler absorbing.

9. The system according to claim 1 wherein the coupler includes a plurality of layers, said layers including a metal layer, a semiconductor layer, and a metal layer.

10. An optical system for absorbing an optical signal, said system comprising:
    a single mode optical input waveguide, said optical signal propagating through the input waveguide;
    a multi-mode interference coupler coupled to the input waveguide and receiving the optical signal, said coupler causing the optical signal to expand into more optical propagation modes, said optical propagation modes interacting with each other to create an area of constructive and destructive interference at a central location in the coupler;
    a single mode optical output waveguide coupled to the coupler at an end opposite to the input waveguide, said optical signal entering the output waveguide; and
    an optical absorbing device defined within the coupler, said optical absorbing device being defined at a location between the area of interference and the output waveguide where the amplitude of the optical signal is increasing.

11. The system according to claim 10 wherein the optical absorbing device is selected from the group consisting of photodetectors and electro-absorption modulators.

12. The system according to claim 10 wherein the coupler includes a plurality of semiconductor layers, said semiconductor layers including a p-type layer, an intrinsic layer and an n-type layer forming a p-i-n diode structure, said absorbing device being defined by the p-i-n diode structure.

13. The system according to claim 12 wherein the intrinsic layer is a multiple quantum well layer that is an optical waveguide within the coupler and the p-type layer and the n-type layer are cladding layers.

14. The system according to claim 12 further comprising a p-ohmic metal in contact with the p-type layer and an n-ohmic metal in contact with the n-type layer, said metals providing an electric potential to the diode structure to generate an electric field across the diode structure to make the coupler absorbing.

15. The system according to claim 12 wherein the semiconductor layers are InP layers.

16. A method of absorbing light, said method comprising the step of:
    generating an optical signal propagating down a single mode waveguide;
    applying the optical signal to a multi-mode waveguide interference coupler;
    expanding the optical signal into multiple optical propagation modes in the coupler and creating an area of constructive and destructive interference in the coupler by the interaction of the optical modes;
    defining an optical absorption device in the coupler proximate the area of interference at a location where the amplitude of the optical signal is increasing; and
    absorbing the optical signal by the optical absorbing device.

17. The method according to claim 16 wherein the step of defining an absorbing device includes selecting an absorbing device from the group consisting of photodetectors and electro-absorption modulators.

18. The method according to claim 16 wherein the step of defining an absorbing device includes the step of applying an electric field across the waveguide coupler.

19. The method according to claim 16 wherein the step of defining an absorbing device includes the step of positioning the absorbing device between the area of interference and a single mode output waveguide.

20. The method according to claim 16 wherein the step of defining an optical absorbing device includes providing a p-i-n reverse biased diode structure.

21. The method according to claim 16 wherein the step of defining an optical absorbing device includes providing a m-s-m structure.

* * * * *